United States Patent
Badrudduza

(10) Patent No.: US 8,773,940 B2
(45) Date of Patent: Jul. 8, 2014

(54) SKEWED SRAM CELL

(75) Inventor: Sayeed A. Badrudduza, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 316 days.

(21) Appl. No.: 13/351,935

(22) Filed: Jan. 17, 2012

(65) Prior Publication Data

US 2013/0182494 A1 Jul. 18, 2013

(51) Int. Cl.
*G11C 8/00* (2006.01)
*G11C 8/16* (2006.01)
*G11C 11/412* (2006.01)

(52) U.S. Cl.
CPC .......... *G11C 8/16* (2013.01); *G11C 11/412* (2013.01)
USPC ...................... 365/230.05; 365/154

(58) Field of Classification Search
CPC .............. G11C 8/16; G11C 11/412
USPC ...................... 365/230.05, 154, 156
See application file for complete search history.

(56) References Cited

U.S. PATENT DOCUMENTS

| | | |
|---|---|---|
| 7,106,620 B2 | 9/2006 | Chang et al. |
| 7,161,827 B2 | 1/2007 | Ramaraju et al. |
| 7,400,523 B2 | 7/2008 | Houston |
| 7,471,544 B2 | 12/2008 | Nakazato et al. |
| 7,586,806 B2 | 9/2009 | Wong |
| 7,903,450 B2 * | 3/2011 | Chuang et al. ............ 365/154 |
| 2008/0089145 A1 * | 4/2008 | Luthra .................. 365/189.14 |
| 2009/0109732 A1 * | 4/2009 | Houston ................. 365/154 |
| 2010/0103719 A1 | 4/2010 | Lee |

* cited by examiner

*Primary Examiner* — Vu Le
(74) *Attorney, Agent, or Firm* — Gary Stanford

(57) ABSTRACT

A memory cell including a cross-coupled latch with corresponding storage nodes, and further including first and second write pass gate transistors and first and second read pass gate transistors. The write pass gate transistors are controlled by a write word line and the read pass transistors are controlled by a read word line. Each read and write pass gate transistor is coupled between a storage node and either a bit line or a complementary bit line. The write pass gate transistors are implemented at a first strength level and the read pass gate transistors are implemented at a second strength level which is less than the first strength level. In this manner, the read and write margins are independently configurable without negatively impacting each other.

20 Claims, 3 Drawing Sheets

SKEWED SRAM CELL

BACKGROUND OF THE INVENTION

1. Field of the Invention

The present invention relates generally to SRAM cells, and more particularly to a skewed SRAM cell with improved operating margins.

2. Description of the Related Art

A static random access memory (SRAM) is generally used in high speed applications, such as memory in a data processing system or the like. Each SRAM cell stores one bit of data and is implemented as a pair of cross-coupled inverters. The SRAM cell is only stable in one of two possible voltage levels. The logic state of the cell is determined by the voltage levels of the storage nodes which are the outputs of the inverters, and can be made to change states by applying a voltage of sufficient magnitude and duration to the appropriate cell input.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
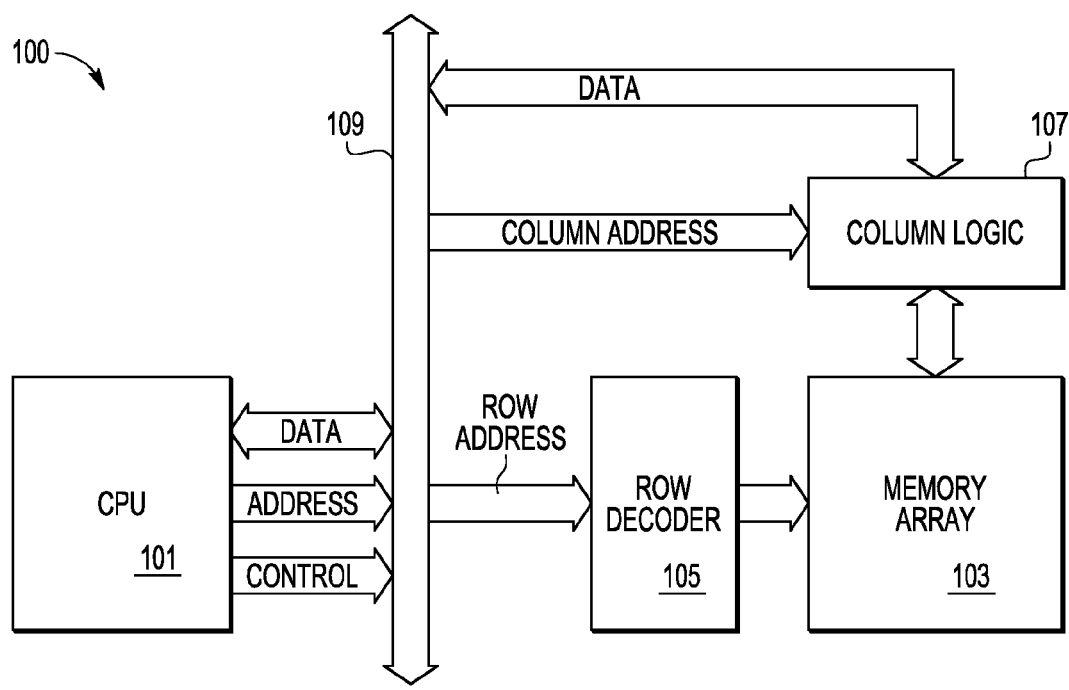
FIG. 1 is a block diagram of a data processing system including a memory array implemented in accordance with one embodiment.

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The conventional 6-transistor (6 T) SRAM cell may suffer from insufficient read and write stability problems. The stability problems are made worse with progressive technology development. For example, newer and/or advanced process technologies have reduced transistor sizes resulting in increased mismatch between the transistors. Furthermore, operational voltages have been decreased in order to meet reduced power budgets. Adjustments of transistor parameters to meet operating requirements are more difficult with lower voltage headroom.

Device symmetry, which is vital in many functions including memory, is more difficult to achieve with greater device variation in the newer process technologies. Inadequate read or write stability translates into higher memory fall out in modern integrated circuit (IC) configurations mostly occupied by SRAM cells.

Read stability of a conventional 6 T SRAM cell may be improved at the expense of write stability and vice versa. Read and write stability are related to or otherwise determined by read and write margins, respectively. An SRAM cell implemented in a complementary metal-oxide semiconductor (CMOS) process typically includes pull-up (PU) transistors, pull-down (PD) transistors and pass gate (PG) transistors. The read margin, evaluated by a parameter called the static noise margin (SNM), is largely dependent upon the relative strength between the PD transistors and the PG transistors. The read margin refers to the relative stability of the cell during a read cycle to ensure that the proper value is read correctly and without any disturbance. In order to ensure a successful read, the PD transistors are made stronger than the PG transistors, or PD>PG. The write margin (WM) is usually determined by the relative strength of the PG transistors relative to the PU transistors. The write margin refers to the relative stability of the cell during a write cycle to ensure that the proper value is successfully and correctly written. In order to ensure a successful write, the PG transistors are made stronger than the PU transistors, or PG>PU. In this manner, the SRAM cell is designed so that PD>PG>PU in terms of relative strength of the transistors in an SRAM cell.

The overall strength ratio between the PU and PD transistors is usually constrained in order to meet other design parameters, such as the hold margin. The hold margin refers to the relative stability of the cell storing a value over time. The process technology often dictates the strength of the P-type or P-channel (e.g., PMOS) transistors used to implement the pull-up devices. Thus, for a given manufacturing process, the strength of the PU transistors is selected along with an overall strength ratio between the PU and PD transistors. The relative strength of the PG transistors is then determined in an attempt to optimize both the read and write margins.

The strength of each transistors is mostly dictated by channel length and width dimensions along with the relative amount of process doping to adjust threshold voltage. The read margin may be improved by decreasing the strength of the PG transistors relative to the PD transistors. The write margin, however, may be improved by increasing the strength of the PG transistors relative to the PU transistors. Given a selected strength ratio between the PU and PD transistors, the read and write margins are competing and conflicting parameters in the conventional SRAM cell since an improvement to one degrades the other and vice-versa. It is particularly difficult to meet both the read and write margins using the newer process technologies with reduced transistor size and source voltage range and increased device mismatch.

Read stability failure is more prominent at hot temperature and memory fall out due to write stability is more often observed at cold temperatures. Different read or write assist techniques have been used in an attempt to make SRAM robust for one operation (e.g., read or write), while making it more susceptible to the other operation. Additionally, 8 T and 10 T SRAM cells have also been proposed in search for a more robust SRAM cell. These assist techniques and SRAM cells involve additional circuitry, complex cell operations, requirements for an additional supply voltages, etc. Furthermore, many such techniques are provided at the expense of increased power consumption and/or slower memory cells.

Generally, an SRAM memory cell according to one embodiment described herein provides improved read and write margins. The cell can be skewed in terms of read and write as necessary making both read and write margins higher simultaneously without compromising the other one. The memory cell does not require any additional supply voltage and hence no extra power supply is required. The operation of the memory cell is also very simple and straightforward and is substantially the same as that of a conventional 6 T SRAM cell. An SRAM memory cell according to various embodiments solves both the read and write margin problems with the utilization of additional pass gate transistors within the cell which may be independently implemented to meet each of the requisite margins as further described herein.

FIG. 1 is a block diagram of a data processing system 100 including a memory array 103 implemented in accordance with one embodiment. The data processing system 100 includes a central processing unit (CPU) 101, a memory array 103, a row decoder 105, a column logic block 107, and a bus 109. As used herein, the term "bus" is used to refer to one or more signals or conductors which may be used to transfer one or more various types of information, such as data, addresses, control, or status. The CPU 101 may be a processor capable of executing instructions, such as a microprocessor, digital signal processor, etc., or may be any other type of bus master, such as for example, a direct memory access (DMA) controller, debug circuitry, or the like. Also, the processor 101 may be a slave device, such as for example, any type of peripheral circuit which resides on the bus or slave device that requires access to a memory.

The CPU 101 is bi-directionally coupled to bus 109, which has one or more conductors for communicating address, data, and control information between CPU 101 and other circuits coupled to bus 109, such as memory array 103. The row decoder 105 has one or more input terminals for receiving a row address from the bus 109 for selecting a row of memory cells in memory array 103. The column logic 107 is bi-directionally coupled to the memory array 103 for providing and receiving data in response to column select signal and control information. The column logic 107 receives a column address, and in response, couples one or columns of memory cells of the memory array 103 to the bus 109. The column logic 107 includes column decoders, sense amplifiers, and pre-charge and equalization circuits. The sense amplifiers are provided for sensing and amplifying the relatively low voltage signals from the selected memory cells. In other embodiments, the column logic 107 may include additional or different circuits for inputting and outputting data from the memory array 103.

During a read operation, data signals labeled "DATA" are read from selected memory cells of memory array 103 and provided to the bus 109. During a write operation the data signals DATA are provided to selected memory cells from the bus 109. Note that in other embodiments, a bus interface block may be coupled between the bus 109 and the memory array 103.

For purposes of clarity, the data processing system 101 is simplified to illustrate only a central processing unit and a memory coupled together via a bus. However, in other embodiments, the data processing system 101 may be more complex, such as including for example, multiple processors coupled to multiple buses, additional memories, and other circuits (not shown).

The data processing system 100 may be implemented on an integrated circuit (IC) using any process technology, such as, for non-limiting example, silicon-on-insulator (SOI) manufacturing technology, bulk silicon, gallium arsenide, etc. The data processing system 100 may alternatively be implemented in a discrete manner, such that any one or more of the individual components or devices may be implemented on a separate IC. The memory array 103, for example, may be implemented using one or more separate memory chips or the like.

The data processing system 100 is suitable for any type of electronic application, such as networking, microcontroller, communication and/or consumer electronics applications. The data processing system 100 may be provided within any type of electronic device (not shown), such as any type of computer system or computing device (e.g., notebook computer, desktop computer, netbook computer, etc.), media tablet devices, communication devices (e.g., cellular phone, smart phone, etc.), or other types of electronic devices (e.g., media player, recording device, etc.). The electronic device may include any type of power system which may include a battery (rechargeable or non-rechargeable) and/or may be configured to operate with an alternating current (AC) adapter or the like.

Figure 2:
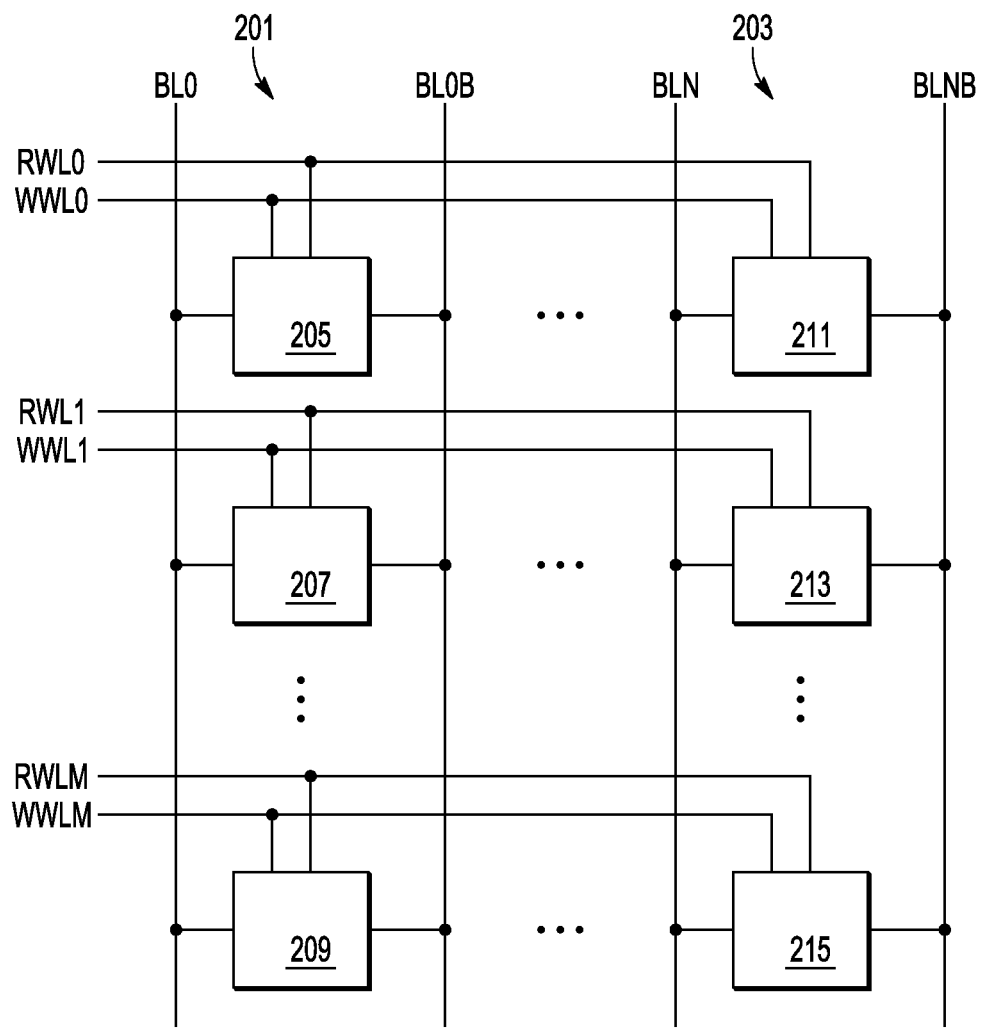
FIG. 2 is a more detailed block diagram of the memory array of FIG. 1 implemented according to one embodiment.

FIG. 2 is a more detailed block diagram of the memory array 103 implemented according to one embodiment. In the memory array 103, the memory cells are organized in rows and columns. A column 201 of memory cells includes a bit line pair and each of the memory cells that are coupled to the bit line pair. For example, the bit line pair labeled BL0 and BL0B and cells 205, 207 and 209 form one column. A last column 203 includes a bit line pair BLN and BLNB and memory cells 211, 213 and 215. Note that memory array 103 includes N+1 columns where N is an integer, so that any number of columns may be included. It is noted that the "B" (bar) added to a signal name indicates that the "B" signal is generally a logical complement. The bit line pairs are used to communicate differential signals to and from the cells during read and write operations.

Each row of the memory array 103 includes a read word line, a write word line and each of the memory cells that are coupled to both word lines. For example, a first row includes a read word line labeled RWL0, a write word line labeled WWL0 and memory cells 205 and 211. Likewise, a second row includes a read word line labeled RWL1, a write word line labeled WWL1 and memory cells 207 and 213. Additional rows may be included in the memory array 103 up to a last row, which includes a read word line labeled RWLM, a write word line labeled WWLM and memory cells 209 and 215 for a total of M+1 rows in which M is an integer.

Figure 3:
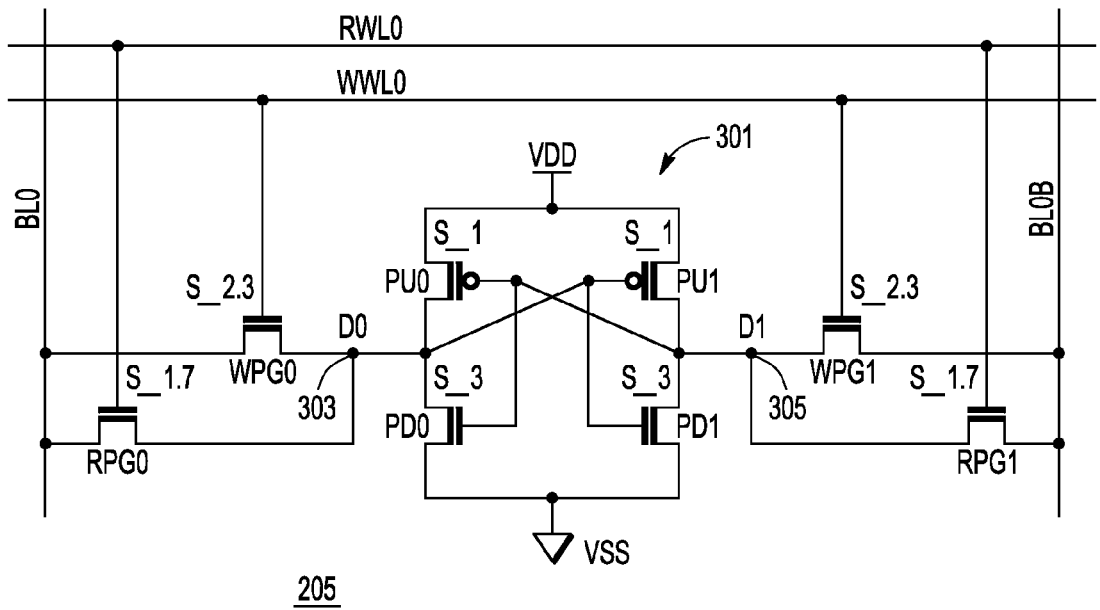
FIG. 3 is a schematic diagram of a single port memory cell of FIG. 2 implemented according to an exemplary embodiment.

FIG. 3 is a schematic diagram of the memory cell 205 implemented as a single port memory cell according to an exemplary embodiment. The memory cell 205 shown in FIG. 3 is representative of the remaining memory cells 207, 209, 211, 213, 215, etc., of the memory array 103 in which each of the memory cells may be implemented in substantially the same manner as the illustrated memory cell 205. The memory cell 205 is configured as an 8 transistor (8 T) skewed single port memory cell with eight transistors including two pull-up transistors PU0 and PU1, two pull-down transistors PD0 and PD1, two write pass gate transistors WPG0 and WPG1, and two read pass gate transistors RPG0 and RPG1. The two pull-up transistors PU0 and PU1 are implemented as PMOS transistors, and the remaining transistors are implemented as NMOS transistors.

The transistors PU0, PU1, PD0 and PD1 of the memory cell 205 form a cross-coupled latch 301 for storing a data bit. In particular, the source terminals of PU0 and PU2 are coupled to an upper source voltage VDD, the drain terminal of PU0 is coupled to a first data storage node 303 developing a data signal D0, and the drain terminal of PU1 is coupled to a second data node 305 developing a data signal D1. The source terminals of PD0 and PD2 are coupled to a reference node VSS, which may have any suitable positive, negative or ground voltage level. The drain terminal of PD0 is coupled to the first data node 303, and the drain terminal of PD1 is coupled to the second data node 305. The gate terminals of PU0 and PD0 are coupled together and to the data node 305, and the gate terminals of PU1 and PD1 are coupled together and to the data node 303. It is noted that PU0 and PD0 collectively form a first inverter, PU1 and PD1 collectively form a second inverter, in which the inverters are cross-coupled so that the data signals D0 and D1 are logical complements of each other.

The transistors WPG0 and WPG1 of the memory cell 205 form a pair of write pass gate transistors for writing a data bit for storage in the memory cell, and the transistors RPG0 and RPG1 form a pair of read pass gate transistors for reading a stored data bit from the memory cell. The drain and source terminals of WPG0 and RPG0 are coupled in parallel between bit line BL0 and data node 303, and the drain and source terminals of WPG1 and RPG1 are coupled in parallel between bit line BL0B and data node 305. The gate terminals of WPG0 and WPG1 are coupled to write word line WWL0, and the gate terminals of RPG0 and RPG1 are coupled to read word line RWL0.

Operation of the memory cell 205 is now generally described. It is assumed that an initial data bit stored in the memory cell 205 is a logic "0" in which data signal D0 is pulled low towards GND and data signal D1 is pulled high towards VDD. Since D0 is low, PU1 is turned on pulling D1 high while PD1 is turned off. D1 pulled high turns PD0 on pulling D0 low while PU0 is turned off. In this manner, the logic state of D0 is a logic "0" and D1 is pulled to the complementary logic state "1" to effectively latch a logic "0" into the memory cell 205.

It is desired to store a logic "1" into the memory cell 205 so that it switches state from logic "0" to logic "1". The word lines WWL0 and RWL0 are initially low turning off the pass gate transistors WPG0, WPG1, RPG0 and RPG1. Prior to a write operation, both of the bit lines BL0 and BL0B are pre-charged high to logic "1". A write "1" is initiated by pulling the complementary bit line BL0B low to logic "0" followed by asserting WWL0 high which turns write pass gate transistors WPG0 and WPG1 on. As BL0B is low and WPG1 is on, the charges on the data node 305 drains to ground so that D1 eventually settles down to logic "0". A logic "0" on D1 turns the pull-up transistor PU0 on and the data node 303 is pulled high so that D0 goes to logic "1". A high logic state on D0 eventually turns pull-down transistor PD1 on and helps D1 stay at logic "0". The logic state of the cross-coupled latch 301 thus switches state from logic "0" to logic "1" in which D0 is logic "1" and D1 is logic "0". After the latch 301 switches state, the write line WWL0 is pulled back low to maintain the latched state of the memory cell 205.

It is desired to read the stored logic state "1" of the memory cell 205. The word lines WWL0 and RWL0 are initially low turning off the pass gate transistors WPG0, WPG1, RPG0 and RPG1. Prior to the read operation, bit lines BL0 and BL0B are both pre-charged high to logic "1". The read operation is initiated by pulling RWL0 high to turn on the read pass gate transistors RPG0 and RPG1. As RPG0 is turned on, node 303 remains high since BL0 is also high. As RPG1 is turned on, the charge on BL0B is drained through node 305 and PD1 to VSS tending to decrease the voltage level of BL0B. BL0B eventually is pulled low towards ground. A differential sense amplifier within the column logic block 107 (FIG. 1) senses the stored value of logic "1" since BL0 is sensed high while BL0B is sensed low.

The complementary operations of reading or writing a logic "0" are substantially similar to the operations of reading or writing a logic "1", except that the opposite transistors within the latch 301 generally transition to and from opposite states. The latch 301 is implemented in a symmetrical manner so that the relative strength of the pull-up transistors PU0 and PU1 are substantially equal to each other, and so that the relative strength of the pull-down transistors PD0 and PD1 are substantially equal to each other. Also, WPG0 and WPG1 are symmetrical in strength with respect to each other, and RPG0 and RPG1 are symmetrical in strength with respect to each other. It is noted, however, that the relative strengths of the write pass gate transistors WPG0 and WPG1 are independent from the relative strengths of the read pass gate transistors RPG0 and RPG1 in order to improve or otherwise optimize both the read and write margins as further described herein.

It is appreciated that during any read or write transaction, certain pairs of the pull-up, pull-down or pass gate transistors contend with each other. The relative strengths of the transistors are designed to ensure not only the success of the transaction, but also the speed and relative stability of the memory cell 205. It is known that the read margin, or SNM, may be improved by decreasing the strength of the PG devices relative to the PD devices, and that the write margin or WM may be improved by increasing the strength of the PG devices relative to the PU devices. In the conventional 6 T memory cell, these margins conflicted with each other since either one of the read and write margins could not be improved without degrading the other margin simply by adjusting the strength of the same set of pass gate transistors.

The memory cell 205, however, is configured to overcome this limitation. The read margin is improved by decreasing the strength of the read pass gate transistors RPG0 and RPG1, and the write margin is improved by increasing the strength of the write pass gate transistors WPG0 and WPG1. In this manner, the read margin is improved without having any effect on the write margin, and the write margin is improved without having any effect on the read margin. Thus, both read and write margins may be improved or otherwise optimized independent of each other. In order to maintain symmetry, the strength of each of the read pass gate transistors RPG0 and RPG1 is implemented to be substantially equal to each other, and the strength of each of the write pass gate transistors WPG0 and WPG1 is also implemented to be substantially equal to each other. Furthermore, in order to maintain overall ratio and success of read and write operations of the SRAM cell, the strength of each of the pass gate transistors remains stronger than the pull-up devices and weaker than the pull-down devices.

As shown in FIG. 3, each of the transistors has a corresponding strength value identified by an "S" number followed by a corresponding strength number. The strength number indicates a relative measure of the strengths of the transistors as further described herein. The pull-up transistors PU0 and PU1 are each shown having a strength value of S_1 (strength of 1) and each of the pull-down transistors PD0 and PD1 are each shown having a strength value of S_3 (strength of 3), in which S_3 indicates a strength level that is three times that of S_1. In a conventional memory cell, the pass gate transistors may have an intermediate strength between the strengths of the pull-up and pull-down transistors in an attempt to meet both read and write margins. For example, an intermediate strength of about 2 (strength value of S_2, which is twice the strength of S_1) may be selected as the strength of the pass gate transistors.

The read pass gate transistors RPG0 and RPG1, however, each have a strength of 1.7 (S_1.7) which is less than the intermediate strength (e.g., about 2). In this manner, the read margin is improved by the reduced strength of the read pass gate transistors RPG0 and RPG1 relative to the intermediate strength level. In one embodiment, the strength of the read pass gate transistors RPG0 and RPG1 is within the range of 1.6-1.9 to improve the read margin. The write pass gate transistors WPG0 and WPG1 each have a strength value of 2.3 (S_2.3) which is greater than the intermediate strength level. In this manner, the write margin is improved by the increased strength of the write pass gate transistors WPG0 and WPG1 relative to the intermediate level. In one embodiment, the strength of the write pass gate transistors WPG0 and WPG1 is within the range of 2.1-2.5 to improve the write margin. Thus, the read margin is improved independently from the write margin, and the write margin is improved independently from the read margin. Thus, the read and write margins may be independently determined so that both may be optimized by proper selection of the relative strengths of the transistors.

The strength of a CMOS transistor (NMOS or PMOS) may be measured by the drive current or "ON" current (ION), which is further determined by transistor size (width and length) and threshold voltage (Vth) for a particular process technology and the corresponding supply voltage. The strength of an N-type (NMOS) transistor is typically higher than that of a P-type (PMOS) transistor with the same size. This is due to the higher mobility of electrons being the charge carrier in N transistors than the mobility of holes being the charge carrier in P transistors. As described above, the P-type pull-up transistors PU0 and PU1 have a strength of S_1 whereas the N-type pull-down transistors PD0 and PD1 have a strength of S_3, which means that the pull-down transistors may carry 3 times the ION current than that of pull-up transistors with the same supply voltage. One way to adjust relative strength is by making the pull-down transistors PD0 and PD1 wider and/or shorter compared to the corresponding pull-up transistors PU0 and PU1. However, PD0 and PD1 being N-type transistors are already somewhat stronger than PU0 and PU1 being P-type transistors. Thus, the amount of increase in width or the decrease in length to make PD0 and PD1 3 times stronger than PU0 and PU1 depend on the sensitivity of the ION current with transistor width and length for a particular process technology.

Another way to implement transistors with a desired strength is to modulate (adjust) the threshold voltage Vth utilizing implant doping conditions (well doping and/or halo doping) during device fabrication, in which a lower threshold voltage Vth results in a higher ION and thus greater strength. Any combination of size and Vth adjustment may be used to achieve a desired strength level for a given transistor.

The read pass gate transistors RPG0 and RPG1 may be made weaker by changing transistor size (e.g., narrowing channel width and/or increasing channel length) and/or by modulating threshold voltage Vth during fabrication. During device fabrication, transistor strength is modulated by adjusting the Vth mask or by adjusting the implant doping dose or the like. The write pass gate transistors WPG0 and WPG1 may be made stronger in similar manner by adjusting transistor size (e.g., increasing channel width and/or decreasing channel length) and/or by modulating threshold voltage Vth during fabrication. It is further noted that during device fabrication, a different mask may be used for the pass gate transistors as compared to the mask used for the pull-down transistors even though both are N-type transistors in order to adjust relative strength.

Figure 4:
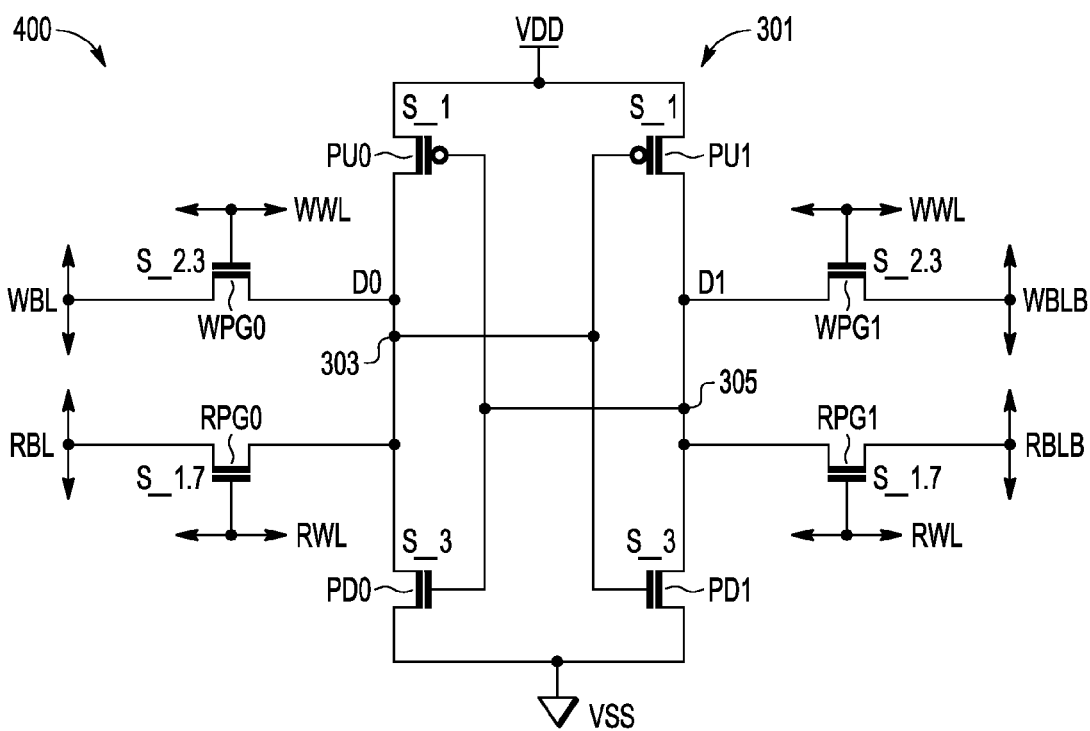
FIG. 4 is a schematic diagram of a dual port memory cell implemented according to another embodiment.

FIG. 4 is a schematic diagram of a dual port memory cell 400 implemented according to another embodiment. The dual port memory cell 400 is configured in a similar manner as the single port memory cell 205 in which similar components assume identical reference numerals. The memory cell 400 includes the cross-coupled latch 301 including pull-up transistors PU0 and PU1 and pull-down transistors PD0 and PD1 coupled to data nodes 303 and 305 between voltage sources VDD and VSS in substantially the same manner. The write pass gate transistors WPG0 and WPG1 and the read pass gate transistors RPG0 and RPG1 are also included. Each of the transistors are shown having the same strength value as described for the memory cell 205, although alternative strength values are contemplated. The write word line is WWL and the read word line is RWL. The bit line BL0 is split in two forming a write bit line WBL and a read bit line RBL. The complementary bit line BL0B is split in two forming a complementary write bit line WBLB and a complementary read bit line RBL. In this case, WPG0 has its drain and source terminals coupled between WBL and node 303, RPG0 has its drain and source terminals coupled between RBL and node 303, WPG1 has its drain and source terminals coupled between WBLB and node 305, and RPG1 has its drain and source terminals coupled between RBLB and node 305.

Operation of the memory cell 400 is substantially similar to that of the memory cell 205 with the exception of the bit lines split into separate complementary read and write bit lines. The complementary bit lines WBL and WBLB are driven to complementary logic values and WWL is asserted high to write a data bit into the latch 301. The complementary bit lines RBL and RBLB are both driven high and RWL is asserted high to read the data bit stored in the latch 301.

Again, each of the read pass gate transistors RPG0 and RPG1 has a reduced strength of 1.7 and each of the write pass gate transistors WPG0 and WPG1 has an increased strength of 2.3. In this manner, the read margin is improved by the reduced strength of the read pass gate transistors and the write margin is improved by the increased strength of the write pass gate transistors. Thus, the read margin is improved independently from the write margin, and the write margin is improved independently from the read margin. In summary, the read and write margins are independently designed so that both may be optimized by proper selection of the relative strengths of the transistors.

A skewed SRAM cell as described herein provides improved read and write margins using two additional pass transistors and an additional word line. Separate pass gate transistors are provided on both sides and controlled by separate read and write word lines. The read word line is used to control the read pass gate transistors during a read operation, and the write word line is used to control the write pass gate transistors during a write operation. The strength of the pass gate transistors are skewed in that the read pass gate transistors may be made weaker whereas the write pass gate transistors may be made stronger thus simultaneously increasing both read and write margins without compromising either one. The skewed SRAM cell as described herein resolves the read and write margin problems of a single SRAM cell. The unique cell does not require any complex circuit and/or timing operations and a single power supply voltage is sufficient. The skewed SRAM cell as described herein may be used in any products utilizing cache, memory, register files or the like. The skewed SRAM cell as described herein may be used in a wider range of operating voltages, operating temperatures, and process conditions. The skewed SRAM cell as described herein has a wider memory operating region and is particularly robust at lower supply voltage levels, and is easier for targeting and modeling.

A memory cell according to one embodiment includes a cross-coupled latch, first and second write pass gate transistors and first and second read pass gate transistors. The cross-coupled latch includes first and second storage nodes. The first write pass gate transistor has a pair of current terminals coupled between the first storage node and a corresponding bit line and has a control terminal coupled to a write word line.

The second write pass gate transistor has a pair of current terminals coupled between the second storage node and a complementary bit line and has a control terminal coupled to the write word line. The first read pass gate transistor has a pair of current terminals coupled between the first storage node and a bit line and has a control terminal coupled to a read word line. The second write pass gate transistor has a pair of current terminals coupled between the second storage node and a complementary bit line and has a control terminal coupled to the read word line. The first and second write pass gate transistors are implemented at a first strength level and the first and second read pass gate transistors are implemented at a second strength level which is less than the first strength level.

The relative strength of the write pass gate transistors is configured to determine a write margin and the relative strength of the read pass gate transistors is configured to determine a read margin. In one embodiment, for example, the cross-coupled latch is implemented with a pull-up strength and a pull-down strength, where the first strength level of the write pass gate transistors is configured relative to the pull-up strength to determine a write margin, and where the second strength level of the read pass gate transistors is configured relative to the pull-down strength to determine a read margin. In this manner, the read and write margins are independently configurable without negatively impacting each other.

A memory array according to one embodiment includes read and write word lines, bit lines and complementary bit lines, and multiple SRAM cells which are coupled to the word and bit lines. Each SRAM cell includes a cross-coupled latch, first and second write pass gate transistors and first and second read pass gate transistors. The first and second write pass gate transistors are implemented at a first strength level and the first and second read pass gate transistors are implemented at a second strength level which is less than the first strength level. The relative strength of the write pass gate transistors is configured to determine a write margin and the relative strength of the read pass gate transistors is configured to determine a read margin.

A method of fabricating a memory cell according to one embodiment includes implementing a cross-coupled latch with first and second storage nodes, implementing a first write pass gate transistor at a first strength level having a pair of current terminals coupled between the first storage node and one of at least one bit line and having a control terminal coupled to a write word line, implementing a second write pass gate transistor at the first strength level having a pair of current terminals coupled between the second storage node and one of at least one complementary bit line having a control terminal coupled to the write word line, implementing a first read pass gate transistor at a second strength level which is less than the first strength level, where the first read pass gate transistor has a pair of current terminals coupled between the first storage node and one of the at least one bit line and has a control terminal coupled to a read word line, and implementing a second read pass gate transistor at the second strength level having a pair of current terminals coupled between the second storage node and one of the at least one complementary bit line and having a control terminal coupled to the read word line.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A memory cell, comprising:
   a cross-coupled latch comprising first and second storage nodes;
   a first write pass gate transistor having a pair of current terminals coupled between said first storage node and one of at least one bit line and having a control terminal coupled to a write word line;
   a second write pass gate transistor having a pair of current terminals coupled between said second storage node and one of at least one complementary bit line and having a control terminal coupled to said write word line;
   a first read pass gate transistor having a pair of current terminals coupled between said first storage node and one of said at least one bit line and having a control terminal coupled to a read word line;
   a second read pass gate transistor having a pair of current terminals coupled between said second storage node and one of said at least one complementary bit line and having a control terminal coupled to said read word line; and
   wherein said first and second write pass gate transistors are implemented at a first strength level and wherein said first and second read pass gate transistors are implemented at a second strength level which is less than said first strength level.

2. The memory cell of claim 1, wherein said at least one bit line comprises a first bit line, wherein said at least one complementary bit line comprises a first complementary bit line, wherein said first write pass gate transistor and said first read pass gate transistor are both coupled to said first bit line, and wherein said second write pass gate transistor and said second read pass gate transistor are both coupled to said first complementary bit line.

3. The memory cell of claim 1, wherein said at least one bit line comprises a read bit line and a write bit line, wherein said at least one complementary bit line comprises a complementary read bit line and a complementary write bit line, wherein said first write pass gate transistor is coupled to said write bit line, wherein said second write pass gate transistor is coupled to said complementary write bit line, wherein said first read pass gate transistor is coupled to said read bit line, and wherein said second read pass gate transistor is coupled to said complementary read bit line.

4. The memory cell of claim 1, wherein said cross-coupled latch is implemented with a pull-up strength and a pull-down strength, wherein said first strength level is configured relative to said pull-up strength to determine a write margin, and wherein said second strength level is configured relative to said pull-down strength to determine a read margin.

5. The memory cell of claim 4, wherein said pull-down strength is about three times said pull-up strength, wherein said first strength level is greater than twice said pull-up strength, and wherein said second strength level is less than twice said pull-up strength.

6. The memory cell of claim 1, wherein said cross-coupled latch comprises pull-up PMOS transistors and pull-down NMOS transistors, and wherein said first and second write pass gate transistors and said first and second read pass gate transistors comprise NMOS transistors.

7. The memory cell of claim 1, wherein said first and second strength levels are measured by relative drive current.

8. The memory cell of claim 1, wherein said first and second strength levels are determined by transistor size and threshold voltage.

9. A memory array, comprising:
a read word line;
a write word line;
a plurality of bit lines;
a plurality of complementary bit lines;
a plurality of SRAM cells, each comprising:
   a cross-coupled latch comprising first and second storage nodes;
   a first write pass gate transistor having a pair of current terminals coupled between said first storage node and one of said plurality of bit lines and having a control terminal coupled to said write word line;
   a second write pass gate transistor having a pair of current terminals coupled between said second storage node and one of said plurality of complementary bit lines and having a control terminal coupled to said write word line;
   a first read pass gate transistor having a pair of current terminals coupled between said first storage node and one of said plurality of bit lines and having a control terminal coupled to said read word line;
   a second read pass gate transistor having a pair of current terminals coupled between said second storage node and one of said plurality of complementary bit lines and having a control terminal coupled to said read word line; and
   wherein said first and second write pass gate transistors are implemented at a first strength level and wherein said first and second read pass gate transistors are implemented at a second strength level which is less than said first strength level.

10. The memory array of claim 9, wherein said first write pass gate transistor and said first read pass gate transistor each have a current terminal coupled to a first bit line, and wherein said second write pass gate transistor and said second read pass gate transistor each have a current terminal coupled to a first complementary bit line.

11. The memory array of claim 9, wherein said plurality of bit lines comprises a plurality of read bit lines and a plurality of write bit lines, wherein said plurality of complementary bit lines comprises a plurality of complementary read bit lines and a plurality of complementary write bit lines, wherein said first write pass gate transistor is coupled to a first write bit line, wherein said second write pass gate transistor is coupled to a first complementary write bit line, wherein said first read pass gate transistor is coupled to a first read bit line, and wherein said second read pass gate transistor is coupled to a first complementary read bit line.

12. The memory array of claim 9, wherein said cross-coupled latch is implemented with a pull-up strength and a pull-down strength, wherein said first strength level is configured relative to said pull-up strength to determine a write margin, and wherein said second strength level is configured relative to said pull-down strength to determine a read margin.

13. The memory array of claim 12, wherein said pull-down strength is about three times said pull-up strength, wherein said first strength level is greater than twice said pull-up strength, and wherein said second strength level is less than twice said pull-up strength.

14. The memory array of claim 9, wherein said cross-coupled latch comprises pull-up PMOS transistors and pull-down NMOS transistors, and wherein said first and second write pass gate transistors and said first and second read pass gate transistors comprise NMOS transistors.

15. The memory array of claim 9, wherein said first and second strength levels are measured by relative drive current.

16. The memory array of claim 14, wherein said first and second strength levels are determined by transistor size and threshold voltage.

17. A method of fabricating a memory cell, comprising:
implementing a cross-coupled latch with first and second storage nodes;
implementing a first write pass gate transistor at a first strength level having a pair of current terminals coupled between the first storage node and one of at least one bit line and having a control terminal coupled to a write word line;
implementing a second write pass gate transistor at the first strength level having a pair of current terminals coupled between the second storage node and one of at least one complementary bit line having a control terminal coupled to the write word line;
implementing a first read pass gate transistor at a second strength level which is less than the first strength level, wherein the first read pass gate transistor has a pair of current terminals coupled between the first storage node and one of the at least one bit line and has a control terminal coupled to a read word line; and
implementing a second read pass gate transistor at the second strength level having a pair of current terminals coupled between the second storage node and one of the at least one complementary bit line and having a control terminal coupled to the read word line.

18. The method of claim 17, further comprising:
implementing the cross-coupled latch with a pull-up strength and a pull-down strength;
implementing the first and second write pass gate transistors at the first strength level which is configured relative to the pull-up strength to determine a write margin; and
implementing the first and second read pass gate transistors at the second strength level which is configured relative to the pull-down strength to determine a read margin.

19. The method of claim 17, wherein said implementing the first and second write pass gate transistors at the first strength level and wherein said implementing the first and second read pass gate transistors at the second strength level comprises fabricating each transistor with a selected size and a selected threshold voltage.

20. The method of claim 17, wherein said implementing the first and second write pass gate transistors at the first strength level and wherein said implementing the first and second read pass gate transistors at the second strength level comprises fabricating each transistor with a target drive current.

* * * * *